(12) United States Patent
Lee et al.

(10) Patent No.: US 10,141,377 B2
(45) Date of Patent: Nov. 27, 2018

(54) ELECTROLUMINESCENT DISPLAY DEVICE

(71) Applicant: LG DISPLAY CO., LTD., Seoul (KR)

(72) Inventors: Sang-Bin Lee, Paju-si (KR); Hye-Min Hwang, Yeongcheon-si (KR); Hui-Kun Yun, Paju-si (KR); Jun-Ho Youn, Seoul (KR); Jun-Young Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 22 days.

(21) Appl. No.: 15/635,888

(22) Filed: Jun. 28, 2017

(65) Prior Publication Data
US 2018/0033836 A1  Feb. 1, 2018

(30) Foreign Application Priority Data

Jul. 29, 2016  (KR) .................. 10-2016-0097257
Dec. 29, 2016  (KR) .................. 10-2016-0182643

(51) Int. Cl.
*H01L 27/32* (2006.01)
*H01L 51/52* (2006.01)
*G09G 3/32* (2016.01)

(52) U.S. Cl.
CPC ...... *H01L 27/3206* (2013.01); *H01L 27/3246* (2013.01); *H01L 27/3258* (2013.01); *H01L 51/5225* (2013.01); *H01L 51/5265* (2013.01); *G09G 3/32* (2013.01); *G09G 2300/0842* (2013.01); *H01L 2227/323* (2013.01)

(58) Field of Classification Search
CPC ............ H01L 27/3206; H01L 27/3246; H01L 27/3258; H01L 51/5225; H01L 51/5265; H01L 2227/323; G09G 3/32; G09G 2300/0842
USPC .............................................. 257/89; 438/45
See application file for complete search history.

(56) References Cited

U.S. PATENT DOCUMENTS

| | | | |
|---|---|---|---|
| 2005/0225232 A1* | 10/2005 | Boroson | H01L 27/3213 313/504 |
| 2007/0075618 A1* | 4/2007 | Mitsuya | H01L 27/3246 313/292 |
| 2011/0215305 A1 | 9/2011 | Kim et al. | |
| 2012/0119239 A1 | 5/2012 | Kim et al. | |
| 2012/0243219 A1 | 9/2012 | Ohsawa et al. | |
| 2014/0110701 A1 | 4/2014 | Noh | |
| 2014/0120645 A1* | 5/2014 | Paek | H01L 27/3211 438/35 |
| 2014/0353599 A1 | 12/2014 | Kang | |

\* cited by examiner

*Primary Examiner* — Cuong Q Nguyen
*Assistant Examiner* — Tong-Ho Kim
(74) *Attorney, Agent, or Firm* — Birch, Stewart, Kolasch & Birch, LLP

(57) ABSTRACT

An electroluminescent display device includes a substrate on which first and second pixel regions are defined, a passivation layer over the substrate, a first electrode in each of the first and second pixel regions on the passivation layer, a bank layer exposing the first electrode, a light emitting layer on the first electrode exposed by the bank layer, and a second electrode on the light emitting layer, wherein the bank layer includes first and second openings exposing the first electrodes corresponding to the first and second pixel regions, respectively, and a depth of the second opening is larger than a depth of the first opening.

15 Claims, 8 Drawing Sheets

ELECTROLUMINESCENT DISPLAY DEVICE

CROSS-REFERENCE TO RELATED APPLICATION

The present application claims priority from and the benefit under 35 U.S.C § 119(a) of Korean Patent Application Nos. 10-2016-0097257 filed on Jul. 29, 2016 and 10-2016-0182643 filed on Dec. 29, 2016, all of which are hereby incorporated by reference in their entirety.

BACKGROUND

Field of the Disclosure

The present disclosure relates to an electroluminescent display device, and more particularly, to an electroluminescent display device, which increases color purity and light extraction efficiency and has a high image quality.

Discussion of the Related Art

Recently, flat panel displays have been widely developed and applied to various fields because of their thin profile, light weight, and low power consumption.

Among the flat panel displays, electroluminescent display devices emit light due to the radiative recombination of an exciton after forming the exciton from an electron and a hole by injecting charges into a light emitting layer between a cathode for injecting electrons and an anode for injecting holes.

The electroluminescent display devices include a flexible substrate such as plastic because they are self-luminous, and have excellent contrast ratios. Further the electroluminescent display devices have a response time of several micro seconds, and there are advantages in displaying moving images. The electroluminescent display devices also have wide viewing angles and are stable under low temperatures. Since the electroluminescent display devices are driven by a low voltage of direct current (DC) 5V to 15V, it is easy to design and manufacture driving circuits. In addition, the manufacturing processes of the electroluminescent display device are simple since only deposition and encapsulation steps are required.

The light emitting layer of the electroluminescent display devices can be formed by selectively depositing a light emitting material using a fine metal mask through a vacuum thermal evaporation method. By the way, it is difficult to apply the evaporation method to a display device with a large size and high resolution because of production deviation, sagging and a shadow effect of the mask.

To solve the problem, there is a method of forming a light emitting layer through a solution process. A related art electroluminescent display device including a light emitting layer formed through the solution process will be described with reference to FIGS. 1 to 2B.

FIG. 1 is a schematic cross-sectional view illustrating a related art electroluminescent display device.

In FIG. 1, red, green and blue pixel regions Pr, Pg and Pb are defined on a substrate 10, and a first electrode 62 is formed in each pixel region Pr, Pg and Pb on the substrate 10. A bank layer 70 is formed on the first electrode 62 and covers edges of the first electrode 62. A light emitting layer 80 is formed on the first electrode 62 surrounded by the bank layer 70. A second electrode 92 is formed on the light emitting layer 80 and the bank layer 70 over substantially all of the substrate 10. The first electrode 62, the light emitting layer 80 and the second electrode 92 constitute a light emitting diode De.

Here, the light emitting layer 80 is formed through a solution process. More particularly, the light emitting layer 80 is formed by dropping a solution including a light emitting material on the first electrode 62 surrounded and exposed by the bank layer 70 in each pixel region Pr, Pg and Pb and then drying the solution. At this time, the bank layer 70 defines an area where the light emitting layer is formed and prevents the dropped solution in each pixel region Pr, Pg and Pb from overflowing into a neighboring pixel region Pr, Pg and Pb.

The light emitting layer 80 can be easily formed in each pixel region Pr, Pg and Pb through the solution process without a mask, and thus a display device having a large size and high definition can be produced.

In the meantime, to increase the color purity and light extraction efficiency of the electroluminescent display device, a structure for implementing a micro-cavity effect has been suggested and applied to the light emitting diode De. More particularly, by selectively amplifying a wavelength using the micro-cavity effect in which light emitting from the light emitting layer 80 causes interference between the two electrodes 62 and 92 to thereby emit a narrow color spectrum, light of high color purity can be obtained and high efficiency at the front side can be achieved.

The micro-cavity effect can be implemented by adjusting a distance between the two electrodes 62 and 92, that is, a thickness of the light emitting layer 80. Since wavelengths of light emitted in the pixel regions Pr, Pg and Pb are different from each other, the light emitting layers 80 are requested to have different thicknesses in the respective pixel regions Pr, Pg and Pb.

The thickness of the light emitting layer 80 can be controlled by the number of drops of a solution, i.e., the amount of the dropped solution when the solution of the same concentration is used. At this time, the limit number of drops for obtaining a required thickness can be determined according to the concentration of the solution and the size of a unit area. When the light emitting layers 80 are formed to have the different thicknesses in the red, green and blue pixel regions Pr, Pg and Pb, the solution can be dropped less than the limit number of drops in one pixel region or can be dropped more than the limit number of drops in another pixel region. When the solution is dropped less than the limit number of drops, a dewet phenomenon can be caused in which the dropped solution does not completely cover the first electrode 62 in the pixel region Pr, Pg and Pb. When the solution is dropped more than the limit number of drops, an overflow phenomenon can be caused in which the dropped solution penetrates into a neighboring pixel region Pr, Pg and Pb beyond the bank layer 70. Therefore, the light emitting layer 80 has a non-uniform thickness.

FIGS. 2A and 2B are schematic views showing profiles of a light emitting layer having a non-uniform thickness in the related art, in which the horizontal axis represents a pixel pitch, and the vertical axis represents the profiles.

In FIG. 2A, the light emitting layer 80 can have an asymmetric U-like shape in which a thickness of one side rapidly increases in comparison with a thickness of the other side. Alternatively, in FIG. 2B, the light emitting layer 80 can have a W-like shape in which a thickness in a center portion increases in comparison with a thickness in edge portions.

The light emitting diode including the light emitting layer 80 of the non-uniform thickness lowers an image quality of a display device because the emission from the light emitting diode is not uniform. In addition, when the light emitting layer 80 has the asymmetric U-like shape of FIG. 2A, the driving voltage of the light emitting diode increases, and the power consumption also increases. When the light emitting layer 80 has the W-like shape of FIG. 2B, the leakage currents are caused, and the lifetime of the light emitting diode is lowered.

To solve the problems, the thickness of the light emitting layer 80 can be controlled using a solution of a different concentration. However, additional materials and apparatus are needed, and the manufacturing costs are increased.

SUMMARY

Accordingly, the present disclosure is directed to an electroluminescent display device that substantially obviates one or more of the problems due to limitations and disadvantages of the related art.

An object of the present disclosure is to provide an electroluminescent display device having an improved image quality.

Another object of the present disclosure is to provide an electroluminescent display device that has a lower power consumption and increased lifetime.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device which includes a substrate on which first and second pixel regions are defined; a passivation layer over the substrate; a first electrode in each of the first and second pixel regions on the passivation layer; a bank layer exposing the first electrode; a light emitting layer on the first electrode exposed by the bank layer; and a second electrode on the light emitting layer, wherein the bank layer includes first and second openings exposing the first electrodes corresponding to the first and second pixel regions, respectively, and wherein a depth of the second opening is larger than a depth of the first opening.

In another aspect, there is provided an electroluminescent display device including a substrate on which first, second and third pixel regions are defined; a passivation layer over the substrate; a first electrode in each of the first, second and third pixel regions on the passivation layer; a bank layer exposing the first electrode; a light emitting layer on the first electrode exposed by the bank layer; and a second electrode on the light emitting layer, wherein the bank layer includes first, second and third openings exposing the first electrodes corresponding to the first, second and third pixel regions, respectively, wherein a height of the bank layer of the third pixel region is different from a height of the bank layer of each of the first and the second pixel regions.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION

Reference will now be made in detail to embodiments of the disclosure, examples of which are illustrated in the accompanying drawings.

Figure 1:
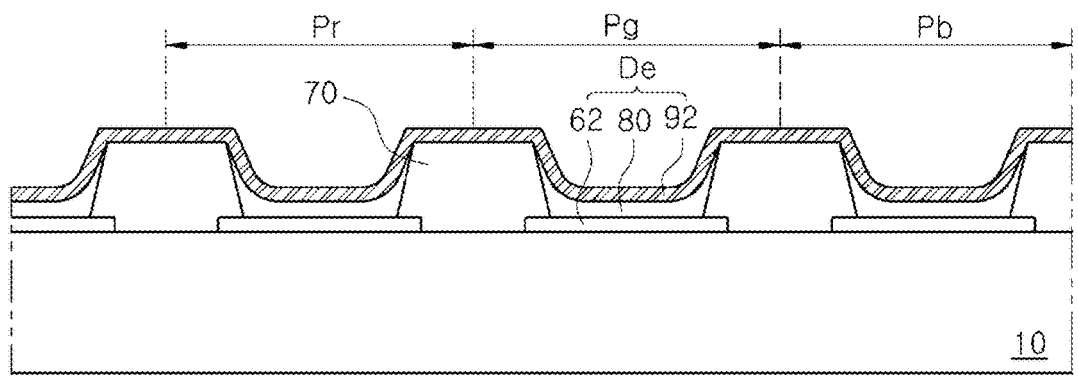
FIG. 1 is a schematic cross-sectional view illustrating a related art electroluminescent display device.
Figure 2A:
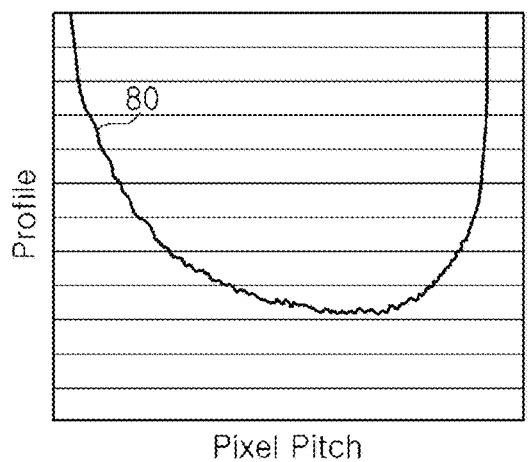
FIGS. 2A and 2B are schematic views showing profiles of a light emitting layer having a non-uniform thickness in the related art.
Figure 2B:
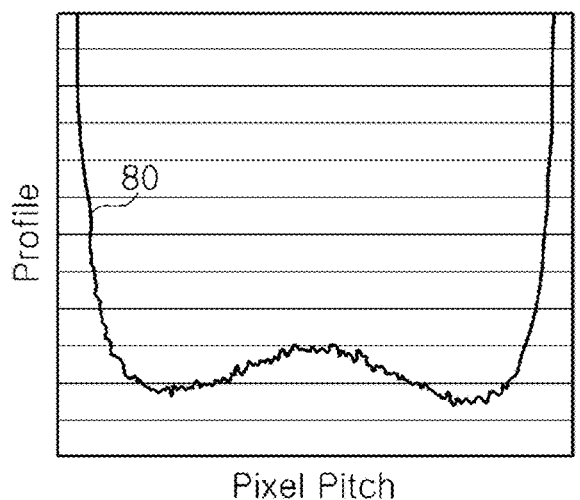
Figure 3:
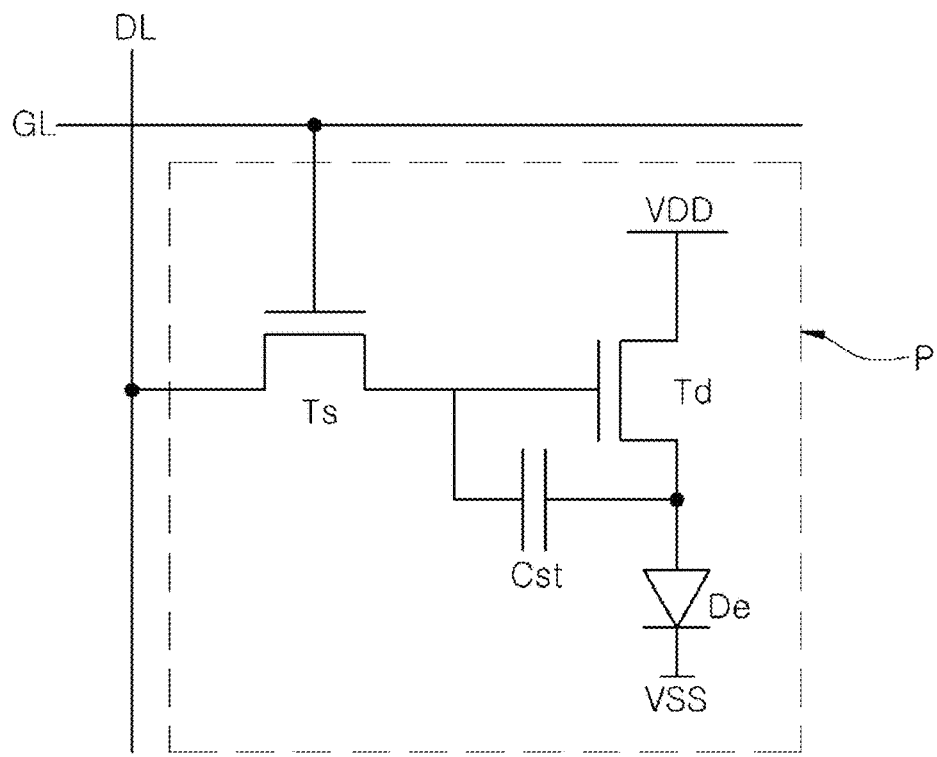
FIG. 3 is a circuit diagram of one pixel region of an electroluminescent display device according to an embodiment of the present disclosure.

FIG. 3 is a circuit diagram of one pixel region of an electroluminescent display device according to an embodiment of the present disclosure. All the components of the electroluminescent display device according to all embodiments of the present disclosure are operatively coupled and configured.

In FIG. 3, the electroluminescent display device according to the embodiment of the present disclosure includes a gate line GL, a data line DL, a switching thin film transistor Ts, a driving thin film transistor Td, a storage capacitor Cst and a light emitting diode De. The gate line GL and the data line DL cross each other to define a pixel region P. The switching thin film transistor Ts, the driving thin film transistor Td, the storage capacitor Cst and the light emitting diode De are formed in the pixel region P.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode De is connected to a drain electrode of the driving thin film transistor Td, and a cathode of the light emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the light emitting diode De is controlled, thereby displaying an image. The light emitting diode De emits light due to the current supplied through the driving thin film transistor Td from the high voltage supply VDD.

Namely, the amount of the current flowing through the light emitting diode De is proportional to the magnitude of the data signal, and the intensity of light emitted by the light emitting diode De is proportional to the amount of the current flowing through the light emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode De to be constant and the gray level shown by the light emitting diode De to be maintained until a next frame.

Meanwhile, one or more transistors and/or capacitors can be added in the pixel region P in addition to the switching and driving thin film transistors Ts and Td and the storage capacitor Cst.

First Embodiment

Figure 4:
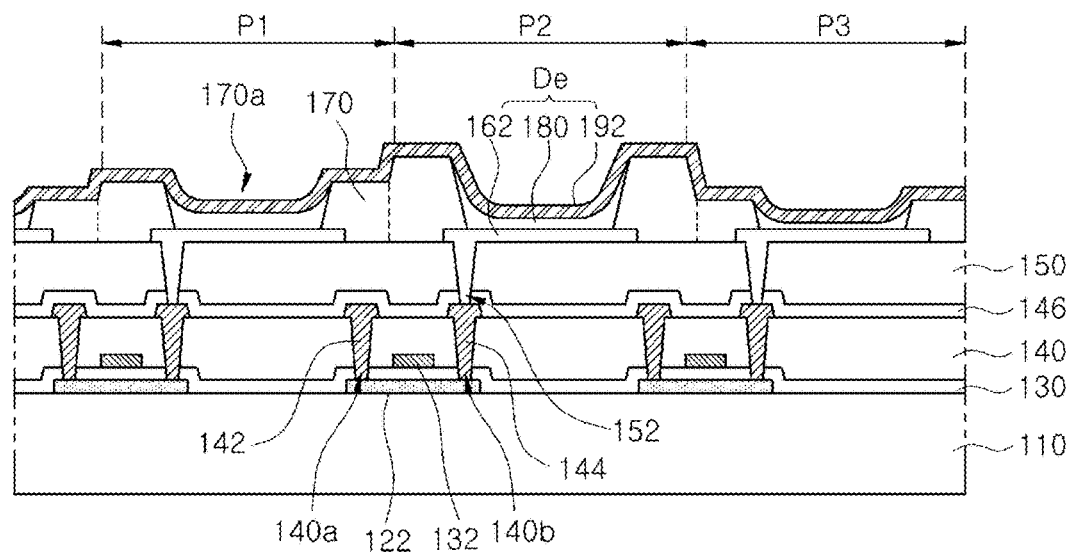
FIG. 4 is a cross-sectional view of an electroluminescent display device according to a first embodiment of the present disclosure.

FIG. 4 is a cross-sectional view of an electroluminescent display device according to a first embodiment of the present disclosure and shows a plurality of pixel regions.

In FIG. 4, a plurality of pixel regions, for example, first, second and third pixel regions P1, P2 and P3 are defined on an insulating substrate 110. A semiconductor layer 122 is formed on the substrate 110 corresponding to each pixel region P1, P2 and P3. The substrate 110 can be a glass substrate or a plastic substrate.

The semiconductor layer 122 can be formed of an oxide semiconductor material. In addition, the electroluminescent display device including the semiconductor layer 122 formed of an oxide semiconductor material can include a light-blocking pattern and a buffer layer formed under the semiconductor layer 122. The light-blocking pattern blocks light from the outside or light emitted from a light emitting diode to prevent the semiconductor layer 122 from being degraded by the light. Alternatively, the semiconductor layer 122 can be formed of polycrystalline silicon, and in this case, impurities can be doped in both ends of the semiconductor layer 122. Additionally, a buffer layer can be formed between the substrate 110 and the semiconductor layer 122.

A gate insulating layer 130 of an insulating material is formed on the semiconductor layer 122 over substantially all of the substrate 110. The gate insulating layer 130 can be formed of an inorganic insulating material such as silicon oxide (SiO$_2$), for example. When the semiconductor layer 122 is formed of polycrystalline silicon, the gate insulating layer 130 can be formed of at least one of silicon oxide (SiO$_2$) and silicon nitride (SiNx).

A gate electrode 132 of a conductive material such as metal is formed on the gate insulating layer 130 to correspond to the semiconductor layer 122, more specifically, to a center portion of the semiconductor layer 122 of each pixel region P1, P2 and P3. In addition, a gate line and a first capacitor electrode can be formed on the gate insulating layer 130. The gate line extends in a first direction, and the first capacitor electrode can be connected to the gate electrode 132.

Here, the electroluminescent display device according to the first embodiment of the present disclosure includes the gate insulating layer 130 formed over substantially all of the substrate 110. Alternatively, the gate insulating layer 130 can be patterned to have the same shape as the gate electrode 132.

An inter insulating layer 140 of an insulating material is formed on the gate electrode 132 over substantially all of the substrate 110. The inter insulating layer 140 can be formed of an inorganic insulating material such as silicon oxide (SiO$_2$) and silicon nitride (SiNx) or an organic insulating material such as benzocyclobutene and photo acryl.

The inter insulating layer 140 includes first and second contact holes 140a and 140b exposing top surfaces of both sides of the semiconductor layer 122. The first and second contact holes 140a and 140b are spaced apart from the gate electrode 132, and the gate electrode 132 is disposed between the first and second contact holes 140a and 140b. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the inter insulating layer 140.

A source electrode 142 and a drain electrode 144 of a conductive material such as metal are formed on the inter insulating layer 140 to correspond to each pixel region P1, P2 and P3. In addition, a data line, a power supply line and a second capacitor electrode can be formed on the inter insulating layer 140. The data line and the power supply line extend in a second direction.

The source and drain electrodes 142 and 144 are spaced apart from each other with respect to the gate electrode 132. The source and drain electrodes 142 and 144 contact both sides of the semiconductor layer 122 through the first and second contact holes 140a and 140b, respectively. The data line can cross the gate line to define the pixel region P1, P2 and P3. In addition, the power supply line can be spaced apart from the data line. The second capacitor electrode can be connected to the drain electrode 144 and can overlap the first capacitor electrode to form a storage capacitor with the inter insulating layer 140 therebetween as a dielectric substance.

In the electroluminescent display device, a thin film transistor includes the semiconductor layer 122, the gate electrode 132, the source electrode 142 and the drain electrode 144. The thin film transistor can have a coplanar structure where the gate electrode 132 and the source and drain electrodes 142 and 144 are disposed at the same side of the semiconductor layer 122, over the semiconductor layer 122. The coplanar structure may be referred to as a top gate structure.

Alternatively, the thin film transistor can have an inverted staggered structure where the gate electrode is disposed under the semiconductor layer and the source and drain electrodes are disposed over the semiconductor layer. The inverted staggered structure may be referred to a bottom gate structure. In this case, the semiconductor layer can be formed of amorphous silicon.

In addition, the thin film transistor can be a driving thin film transistor of the electroluminescent display device. A switching thin film transistor can have the same structure as the driving thin film transistor formed over the substrate 110 to correspond to each pixel region P1, P2 and P3. At this time, the gate electrode 132 of the driving thin film transistor is connected to a drain electrode of the switching thin film transistor, and the source electrode 142 of the driving thin film transistor is connected to the power supply line. Also, the gate electrode and the source electrode of the switching thin film transistor are connected to the gate line and the data line, respectively.

A first passivation layer 146 of an insulating material and a second passivation layer 150 of an insulating material are sequentially formed on the source and drain electrodes 142 and 144 over substantially all of the substrate 110. The first passivation layer 146 can be formed of an inorganic insulating material such as silicon oxide ($SiO_2$) and silicon nitride (SiNx), and the second passivation layer 150 can be formed of an organic insulating material such as benzocyclobutene and photo acryl. The second passivation layer 150 can have a flat top surface.

The first and second passivation layers 146 and 150 have a drain contact hole 152 exposing the drain electrode 144. In FIG. 4, although the drain contact hole 152 is formed directly over the second contact hole 140b, the drain contact hole 152 can be spaced apart from the second contact hole 140b.

One of the first and second passivation layers 146 and 150 can be omitted. For example, the first passivation layer 146 of an inorganic insulating material can be omitted.

A first electrode 162 of a conductive material having a relatively high work function is formed on the second passivation layer 150. The first electrode 162 is disposed in each pixel region P1, P2 and P3 and contacts the drain electrode 144 through the drain contact hole 152. For example, the first electrode 162 can be formed of a transparent conductive material such as indium tin oxide (ITO) and indium zinc oxide (IZO).

A bank layer 170 of an insulating material is formed on the first electrode 162. The bank layer 170 corresponds to peripheries of each pixel region P1, P2 and P3 and covers edges of the first electrode 162. The bank layer 170 has an opening 170a exposing the first electrode 162 in each pixel region P1, P2 and P3. A portion of the bank layer 170 of one pixel region P1, P2 and P3 is connected to a portion of the bank layer 170 of another pixel region P1, P2 and P3 to form one body.

The bank layer 170 can be formed of a material having relatively low surface energy to increase a contact angle with a material of a light emitting layer formed later such that the material of the light emitting layer is prevented from overflowing into a neighboring pixel region P1, P2 and P3. For example, the bank layer 170 can be formed of an organic insulating material having a hydrophobic property. Alternatively, the bank layer 170 can be formed by applying an organic insulating material and then performing a hydrophobic treatment process.

Here, the portions of the bank layer 170 of the first, second and third pixel regions P1, P2 and P3 have different heights, and this will be described in detail later.

A light emitting layer 180 is formed on the first electrode 162 exposed by the opening 170a of the bank layer 170 in each pixel region P1, P2 and P3. The light emitting layer 180 in each pixel region P1, P2 and P3 includes a light emitting material and emits one of red, green and blue light. The light emitting material can be an organic light emitting material. Alternatively, the light emitting material can be an inorganic light emitting material such as a quantum dot.

Here, the light emitting layers 180 in the first, second and third pixel regions P1, P2 and P3 have different thicknesses. More particularly, each of the light emitting layers 180 in the first, second and third pixel regions P1, P2 and P3 has a thickness for implementing a micro cavity effect considering its emission wavelength. The thickness of the light emitting layer 180 can increase as the emission wavelength increases.

For instance, the light emitting layer 180 in the first pixel region P1 can emit red light, the light emitting layer 180 in the second pixel region P2 can emit green light, and the light emitting layer 180 in the third pixel region P3 can emit blue light. At this time, the thickness of the light emitting layer 180 in the second pixel region P2 can be smaller than the thickness of the light emitting layer 180 in the first pixel region P1 and larger than the thickness of the light emitting layer 180 in the third pixel region P3. Here, the thickness of the light emitting layer 180 means a thickness at a central portion of each pixel region P1, P2 and P3.

The light emitting layer 180 can be formed through a solution process. A printing method or a coating method using an injection apparatus including a plurality of nozzles, not limited to this, can be used as the solution process. For example, an inkjet printing method can be used as the solution process.

The light emitting layer 180 in each pixel region P1, P2 and P3 can include a hole auxiliary layer, a light emitting material layer and an electron auxiliary layer sequentially layered on the first electrode 162. The hole auxiliary layer can include at least one of a hole injecting layer and a hole transporting layer, and the electron auxiliary layer can include at least one of an electron transport layer and an electron injecting layer.

Here, the thickness of the light emitting layer 180 in each pixel region P1, P2 and P3 can be changed according to a thickness of the hole auxiliary layer. Namely, the thickness of the hole auxiliary layer in the second pixel region P2 can be smaller than the thickness of the hole auxiliary layer in the first pixel region P1 and larger than the thickness of the hole auxiliary layer in the third pixel region P3. Accordingly, the light emitting layers 180 in the first, second and third pixel regions P1, P2 and P3 can have different thicknesses depending on the thicknesses of the hole auxiliary layers.

In the meantime, the hole auxiliary layer and the light emitting material layer can be formed only in the opening 170a, and the electron auxiliary layer can be formed over substantially all of the substrate 110. In this case, the hole auxiliary layer and the light emitting material layer can be formed through the solution process, and the electron auxiliary layer can be formed through a vacuum thermal evaporation process.

A second electrode 192 of a conductive material having relatively low work function is formed on the light emitting layer 180 over substantially all of the substrate 110. Here, the second electrode 192 can be formed of aluminum (Al), magnesium (Mg), silver (Ag) or their alloy.

The first electrode 162, the light emitting layer 180 and the second electrode 192 constitute a light emitting diode De. The first electrode 162 functions as an anode, and the second electrode 192 serves as a cathode.

Here, the electroluminescent display device according to the first embodiment can be a top emission type where light emitted from the light emitting layer 180 is outputted to the outside through the second electrode 192. At this time, the first electrode 162 further includes a reflective layer of an opaque conductive material. For example, the reflective layer can be formed of aluminum-palladium-copper (APC) alloy, and the first electrode 162 can have a triple-layered structure of ITO/APC/ITO. In addition, the second electrode 192 can have a relatively thin thickness such that light is transmitted therethrough. At this time, the transmittance of the second electrode 192 can be about 45 to 50%, for example.

Alternatively, the electroluminescent display device according to the embodiment can be a bottom emission type where light emitted from the light emitting layer 180 is outputted to the outside through the first electrode 162.

Like this, in the electroluminescent display device according to the first embodiment, since the light emitting layers 180 are formed through the solution process, which is applicable to a relatively small area, an electroluminescent display device having a large size and high definition can be produced. In addition, by forming the light emitting layers 180 having the different thicknesses in the respective pixel regions P1, P2 and P3, the micro cavity effect is implemented, and thus the color purity and light extraction efficiency can be improved.

At this time, the heights of the portions of the bank layer 170 in the respective pixel regions P1, P2 and P3 are different from each other, and the light emitting layer 180 in each pixel region P1, P2 and P3 has the uniform thickness. Therefore, the image quality of the device can be improved.

Moreover, this prevents or minimizes an increase in the power consumption and the lowering of the lifetime of the device due to the non-uniform thickness of the light emitting layer 180.

The relationship between the height of the bank layer 170 and the thickness of the light emitting layer 180 according to the first embodiment of the present disclosure will be described in detail with reference to the accompanying drawing.

Figure 5:
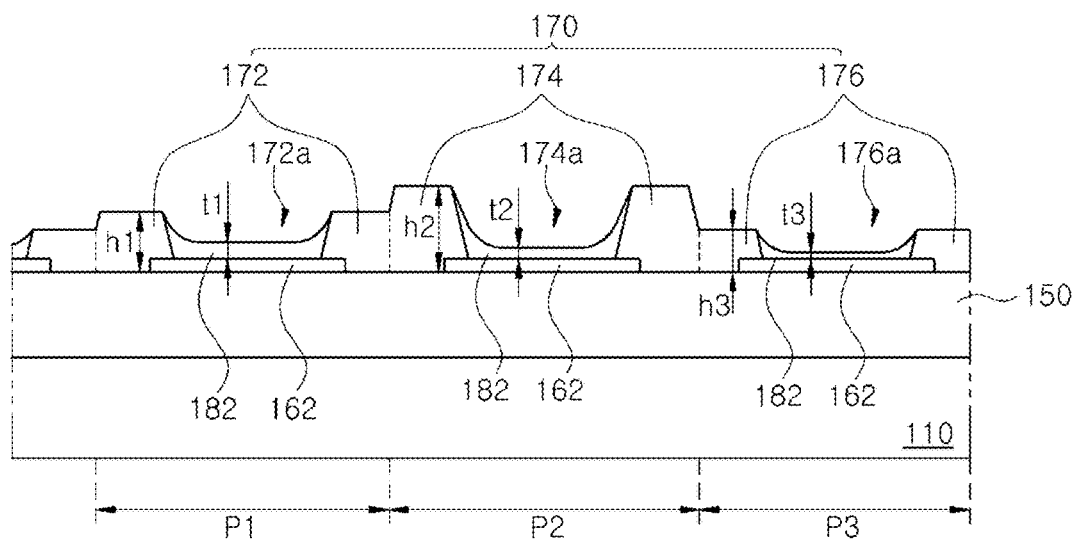
FIG. 5 is a schematic cross-sectional view of an electroluminescent display device according to the first embodiment of the present disclosure.

FIG. 5 is a schematic cross-sectional view of an electroluminescent display device according to the first embodiment of the present disclosure and shows first electrodes, banks and hole auxiliary layers. Here, the hole auxiliary layers can be hole injecting layers.

In FIG. 5, a passivation layer 150 is formed on a substrate 110 on which first, second and third pixel regions P1, P2 and P3 are defined. A first electrode 162 is formed in each pixel region P1, P2 and P3 on the passivation layer 150.

Here, the first, second and third pixel regions P1, P2 and P3 have substantially the same size. For example, the first, second and third pixel regions P1, P2 and P3 can correspond to red, green and blue pixel regions, respectively. In addition, the passivation layer 150 can correspond to the second passivation layer 150 of FIG. 4.

Meanwhile, one or more thin film transistors are formed between the substrate 110 and the passivation layer 150 to correspond to each pixel region P1, P2 and P3.

A bank layer 170 is formed on the first electrode 162 in each pixel region P1, P2 and P3. The bank layer 170 includes first, second and third banks 172, 174 and 176 corresponding to the first, second and third pixel regions P1, P2 and P3, respectively. The first, second and third banks 172, 174 and 176 are disposed in peripheries of the first, second and third pixel regions P1, P2 and P3, respectively. The first, second and third banks 172, 174 and 176 have first, second and third openings 172a, 174a and 176a exposing the first electrodes 162 in the first, second and third pixel regions P1, P2 and P3, respectively.

The portion of the bank layer 170 in one pixel region P1, P2 and P3 is connected to the portion of the bank layer 170 in another pixel region P1, P2 and P3, and the bank layer 170 is formed over substantially all of the substrate 110 in one body. That is, the adjacent first and second banks 172 and 174 are connected to each other, the adjacent second and third banks 174 and 176 are connected to each other, and the adjacent first and third banks 172 and 176 are connected to each other, thereby forming one body.

Here, the first, second and third banks 172, 174 and 176 have different heights. Namely, the first bank 172 in the first pixel region P1 has a first height h1, the second bank 174 in the second pixel region P2 has a second height h2, and the third bank 176 in the third pixel region P3 has a third height h3. At this time, the first height h1 is smaller than the second height h2 and larger than the third height h3. For example, the first height h1 can be 1 μm to 1.5 μm the second height h2 can be 1.5 μm to 2.0 μm and the third height h3 can be 0.7 μm to 1 μm. However, the heights h1, h2 and h3 are not limited to these.

Next, a hole injecting layer 182 is formed on the first electrode 162 exposed by the opening 172a, 174 and 176a in each pixel region P1, P2 and P3. At this time, the hole injecting layer 182 is formed through the solution process. The hole injecting layers 182 have different thicknesses in the first, second and third pixel regions P1, P2 and P3, respectively, by differently dropping a solution in the respective pixel regions P1, P2 and P3. That is, by decreasing the number of drops of the solution in the order of the first, second and third pixel regions P1, P2 and P3, the hole injecting layer 182 of the first pixel region P1 has a first thickness t1, the hole injecting layer 182 of the second pixel region P2 has a second thickness t2, and the hole injecting layer 182 of the third pixel region P3 has a third thickness t3. Here, each of the first, second and third thicknesses t1, t2 and t3 means a thickness at a central portion of each pixel region P1, P2 and P3.

The second thickness t2 is smaller than the first thickness t1 and larger than the third thickness t3. For instance, the first thickness t1 can be 70 nm to 80 nm, the second thickness t2 can be 50 nm to 60 nm, and the third thickness t3 can be 30 nm. The thicknesses t1, t2 and t3 are not limited to these.

Next, a hole transporting layer and a light emitting material layer are sequentially formed on the hole injecting layer 182 in each pixel region P1, P2 and P3 through a solution process.

Like this, in the electroluminescent display device according to the first embodiment of the present disclosure, by differently forming the thicknesses of the hole injecting layers 182, the light emitting layers 180 of FIG. 4 can have different thicknesses in the first, second and third pixel regions P1, P2 and P3.

At this time, by differently forming the heights h1, h2 and h3 of the bank layer 170 in the first, second and third pixel regions P1, P2 and P3, it is not needed to limit the number of drops of the solution for the required thickness, and thus the overflow or dewet phenomenon can be prevented.

In the meantime, the second height h2 of the bank layer 170 in the second pixel region P2 is larger than the first height h1 of the bank layer 170 in the first pixel region P1, while the first thickness t1 of the hole injecting layer 182 in the first pixel region P1 is larger than the second thickness t2 of the hole injecting layer 182 in the second pixel region P2. Accordingly, it is possible to solve a problem that a thickness of a layer becomes thin at a central portion of a pixel region and the layer has low uniformity at central and peripheral portions of the pixel region because a pile-up phenomenon increases at the peripheral portion of the pixel region as the height of the bank layer 170 increases when the solution is dried. That is, the pile-up phenomenon can be restrained as the height of the bank layer 170 is lowered, and the thickness of the hole injecting layer 182 can be increased. In addition, as the height of the bank layer 170 is lowered, the number of drops of the solution corresponding to the same thickness can be decreased. Therefore, by lowering the height of the first bank 172 in the first pixel region P1 where the hole injecting layer 182 of the thickest thickness is formed, the first thickness t1 of the hole injecting layer 182 can be obtained and a material for the hole injecting layer 182 can be reduced.

Figure 6:
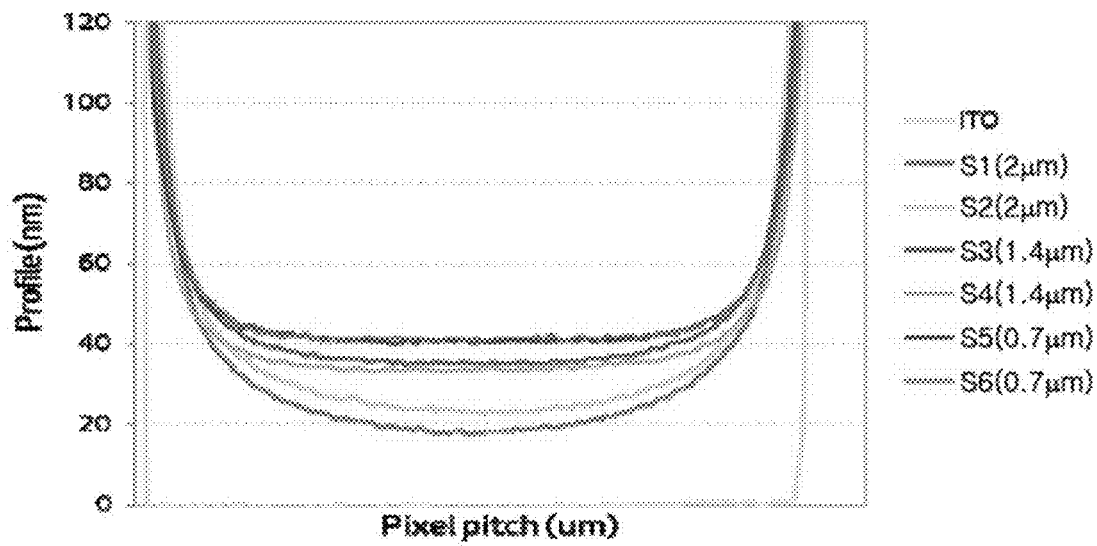
FIG. 6 is a schematic view illustrating profiles of hole injecting layers depending on heights of bank layers.

FIG. 6 is a schematic view illustrating profiles of hole injecting layers depending on heights of bank layers, in which the horizontal axis represents a pixel pitch, and the vertical axis represents the profiles. Here, the number of drops of a solution, i.e., the amount of dropped solution is the same for the hole injecting layers. The bank layers of first and second samples S1 and S2 have the height of 2 µm the bank layers of third and fourth samples S3 and S4 have the height of 1.4 µm and the bank layers of fifth and sixth samples S5 and S6 have the height of 0.7 µm.

In FIG. 6, when the hole injecting layers are formed by dropping the predetermined amount of the solution by the same number of drops and drying the dropped solution, it can be confirmed that the thickness of the hole injecting layer increases and becomes uniform as the height of the bank layer decreases.

Accordingly, in the present disclosure, by lowering the height of the bank 172 of FIG. 5 in the first pixel region P1 of FIG. 5 as compared with the height of the bank 174 of FIG. 5 in the second pixel region P2 of FIG. 5, the first thickness t1 of FIG. 5 of the hole injecting layer 182 of FIG. 5 in the first pixel region P1 of FIG. 5 can be thicker than the second thickness t2 of FIG. 5 of the hole injecting layer 182 of FIG. 5 in the second pixel region P2 of FIG. 5 while the number of drops of the solution in the first pixel region P1 of FIG. 5 is decreased as compared with the second pixel region P2 of FIG. 5. Therefore, the material and manufacturing costs can be reduced.

In the meantime, the height of the bank layer corresponds to a depth of the opening. Thus, while in the first embodiment of the present invention, the banks of the bank layer are formed to have different heights in respective pixel regions, thereby forming different thicknesses of the light emitting layers, in the second embodiment of the present disclosure, the openings are formed to have different depths in respective pixel regions, thereby forming different thicknesses of the light emitting layers.

Second Embodiment

Figure 7:
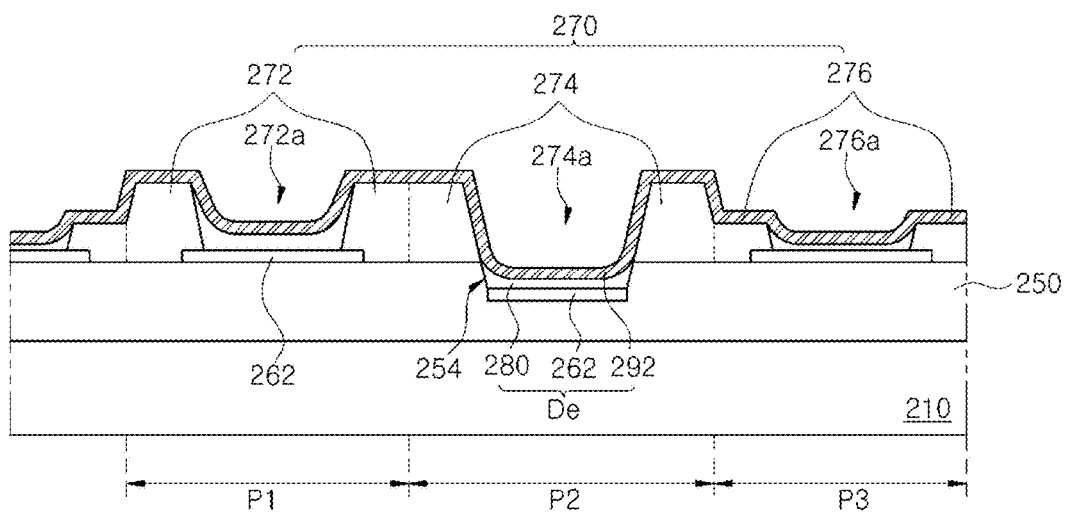
FIG. 7 is a schematic cross-sectional view of an electroluminescent display device according to a second embodiment of the present disclosure.

FIG. 7 is a schematic cross-sectional view of an electroluminescent display device according to the second embodiment of the present disclosure.

In FIG. 7, first, second and third pixel regions P1, P2 and P3 are defined on a substrate 210, and a passivation layer 250 is formed on the substrate 210.

Here, the first, second and third pixel regions P1, P2 and P3 have substantially the same size. For example, the first, second and third pixel regions P1, P2 and P3 can correspond to red, green and blue pixel regions, respectively.

The passivation layer 250 has a groove 254 corresponding to the second pixel region P2. At this time, the passivation layer 250 can correspond to the second passivation layer 150 of FIG. 4.

Meanwhile, one or more thin film transistors are formed between the substrate 210 and the passivation layer 250 to correspond to each pixel region P1, P2 and P3. The thin film transistors can have, but are not limited to, the same structure as those shown in FIG. 4.

Then, a first electrode 262 of a conductive material having a relatively high work function is formed on the passivation layer 250 in each pixel region P1, P2 and P3. Here, the first electrode 262 of the second pixel region P2 can be disposed in the groove 254 of the passivation layer 250.

The first electrode 262 in each pixel region P1, P2 and P3 contacts a drain electrode of the thin film transistor through a drain contact hole that is formed in the passivation layer 250.

Next, a bank layer 270 is formed on the first electrode 262 to correspond to peripheries of each pixel region P1, P2 and P3. The bank layer 270 can be formed of a material having relatively low surface energy to increase a contact angle with a material of a light emitting layer such that the material of the light emitting layer is prevented from overflowing into a neighboring pixel region P1, P2 and P3 when the light emitting layer is formed later. For example, the bank layer 270 can be formed of an organic insulating material having a hydrophobic property. Alternatively, the bank layer 270 can be formed by applying an organic insulating material and then performing a hydrophobic treatment process.

The bank layer 270 includes first, second and third banks 272, 274 and 276 corresponding to the first, second and third pixel regions P1, P2 and P3, respectively. At this time, the banks 272, 274 and 276 of the bank layer 270 in adjacent pixel regions P1, P2 and P3 are connected to each other, and the bank layer 270 is formed over substantially all of the substrate 210 in one body. Namely, the adjacent first and second banks 272 and 274 are connected to each other, the adjacent second and third banks 274 and 276 are connected to each other, and the adjacent first and third banks 272 and 276 are connected to each other, thereby forming one body.

Meanwhile, the first, second and third banks 272, 274 and 276 have first, second and third openings 272a, 274a and 276a exposing the first electrodes 262 in the first, second and third pixel regions P1, P2 and P3, respectively.

Here, the first, second and third openings 272a, 274a and 276a have different depths.

More particularly, the second opening 274a in the second pixel electrode P2 includes the groove 254 of the passivation layer 250. In addition, the first bank 272 and the second bank 274 have the same height, and a height of the third bank 276 is smaller than each of the height of the first and second banks 272 and 274. Accordingly, the depth of the first opening 272a is smaller than the depth of the second opening 274a and larger than the depth of the third opening 276a.

The first, second and third openings 272a, 274a and 276a in the respective pixel regions P1, P2 and P3 have the same size (i.e., width and length), and the first, second and third pixel regions P1, P2 and P3 can have the same aperture ratio.

In the meantime, the bank layer 270 can cover edges of the first electrode 262 in each pixel region P1, P2 and P3. At this time, in the second pixel region P2, the first electrode 262 can be formed on a side surface of the groove 254.

Next, a light emitting layer 280 is formed on the first electrode 262 exposed by each opening 272a, 274a and 276a. The light emitting layer 280 in each pixel region P1, P2 and P3 includes a light emitting material and emits one of red, green and blue light. The light emitting material can be an organic light emitting material. Alternatively, the light emitting material can be an inorganic light emitting material such as a quantum dot.

Here, the light emitting layers 280 in the first, second and third pixel regions P1, P2 and P3 have different thicknesses. More particularly, each of the light emitting layers 280 in the first, second and third pixel regions P1, P2 and P3 has a thickness for implementing a micro cavity effect considering its emission wavelength. The thickness of the light emitting layer 180 can increase as the emission wavelength increases.

For instance, the light emitting layer 280 in the first pixel region P1 can emit red light, the light emitting layer 280 in the second pixel region P2 can emit green light, and the light emitting layer 280 in the third pixel region P3 can emit blue light. At this time, the thickness of the light emitting layer 280 in the second pixel region P2 can be smaller than the thickness of the light emitting layer 280 in the first pixel region P1 and larger than the thickness of the light emitting layer 280 in the third pixel region P3. Here, the thickness of the light emitting layer 280 means a thickness at a central portion of each pixel region P1, P2 and P3.

The light emitting layer 280 can be formed through a solution process. A printing method or a coating method using an injection apparatus including a plurality of nozzles, not limited to this, can be used as the solution process. For example, an inkjet printing method can be used as the solution process.

The light emitting layer 280 in each pixel region P1, P2 and P3 can include a hole auxiliary layer, a light emitting material layer and an electron auxiliary layer sequentially layered on the first electrode 262. The hole auxiliary layer can include at least one of a hole injecting layer and a hole transporting layer, and the electron auxiliary layer can include at least one of an electron transport layer and an electron injecting layer.

Here, the thickness of the light emitting layer 280 in each pixel region P1, P2 and P3 can be changed according to a thickness of the hole auxiliary layer. Namely, the thickness of the hole auxiliary layer in the second pixel region P2 can be smaller than the thickness of the hole auxiliary layer in the first pixel region P1 and larger than the thickness of the hole auxiliary layer in the third pixel region P3. Accordingly, the light emitting layers 280 in the first, second and third pixel regions P1, P2 and P3 can have different thicknesses depending on the thicknesses of the hole auxiliary layers.

In the meantime, the hole auxiliary layer and the light emitting material layer can be formed only in each opening 272a, 274a and 276a and the electron auxiliary layer can be formed over substantially all of the substrate 210. In this case, the hole auxiliary layer and the light emitting material layer can be formed through the solution process, and the electron auxiliary layer can be formed through a vacuum thermal evaporation process.

A second electrode 292 of a conductive material having relatively low work function is formed on the light emitting layer 280 over substantially all of the substrate 210. Here, the second electrode 292 can be formed of aluminum (Al), magnesium (Mg), silver (Ag) or their alloy.

The first electrode 262, the light emitting layer 280 and the second electrode 292 constitute a light emitting diode De. The first electrode 262 functions as an anode, and the second electrode 292 serves as a cathode.

Like this, in the electroluminescent display device according to the second embodiment, since the light emitting layers 280 are formed through the solution process, which is applicable to a relatively small area, an electroluminescent display device having a large size and high definition can be produced. In addition, by forming the light emitting layers 280 having the different thicknesses in the respective pixel regions P1, P2 and P3, the micro cavity effect is implemented, and thus the color purity and light extraction efficiency can be improved.

At this time, the depths of the openings 272a, 274a and 276a in the respective pixel regions P1, P2 and P3 are different from each other, and the light emitting layer 280 in each pixel region P1, P2 and P3 has the uniform thickness. Therefore, the image quality of the device can be improved.

Moreover, this prevents or minimizes an increase in the power consumption and the lowering of the lifetime of the device due to the non-uniform thickness of the light emitting layer 280.

A manufacturing method of an electroluminescent display device according to the second embodiment of the present disclosure will be described in more detail with reference to the accompanying drawings.

FIGS. 8A to 8G are schematic cross-sectional views of an electroluminescent display device in steps of manufacturing the same according to the second embodiment of the present disclosure.

Figure 8A:
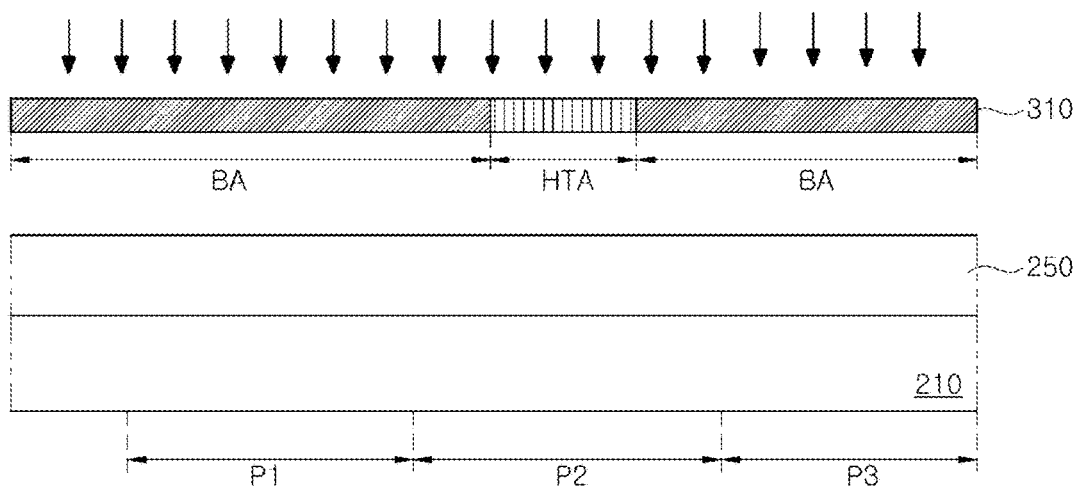
FIGS. 8A to 8G are schematic cross-sectional views of an electroluminescent display device in steps of manufacturing the same according to the second embodiment of the present disclosure.

In FIG. 8A, a passivation layer 250 is formed by applying an organic insulating material on a substrate on which first, second and third pixel regions P1, P2 and P3 are defined. Here, the first, second and third pixel regions P1, P2 and P3 have substantially the same size. For example, the first, second and third pixel regions P1, P2 and P3 can correspond to red, green and blue pixel regions, respectively.

Meanwhile, one or more thin film transistors are formed between the substrate 210 and the passivation layer 250 to correspond to each pixel region P1, P2 and P3.

Then, a first photo mask 310 is disposed over the passivation layer 250, and the passivation layer 250 is exposed to light through the first photo mask 250. The passivation layer 250 can be formed of a photosensitive material and can have a positive photosensitivity in which a portion exposed to light is removed after a developing step.

Alternatively, a photosensitive layer can be formed on the passivation layer 250, and the photosensitive layer can be exposed to light through the first photo mask 310.

The first photo mask 310 includes a light-blocking area BA, a light-transmitting area and a half-light transmitting area HTA. The light-transmitting area of the first photo mask 310 corresponds to a drain electrode of the thin film transistor of each pixel region P1, P2 and P3. In addition, the half-light transmitting area HTA corresponds to the second pixel region P2, and the light-blocking area BA corresponds to the other areas excluding the drain electrode of each pixel region P1, P2 and P3 and the second pixel region P2.

Figure 8B:
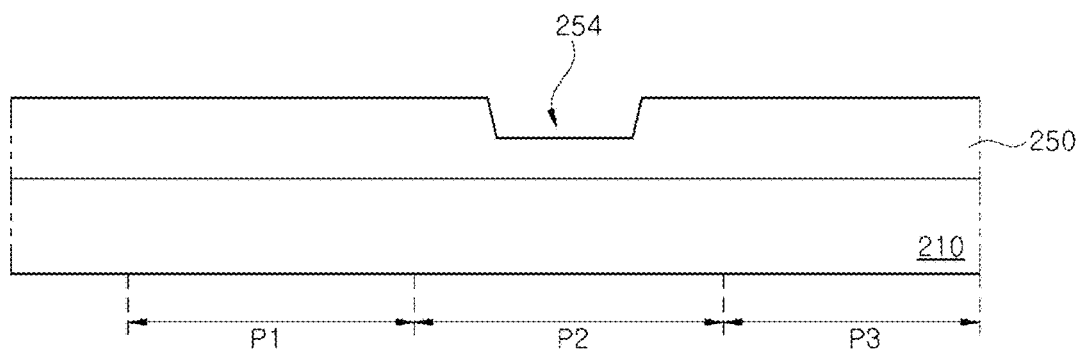

Next, in FIG. 8B, the passivation layer 250 exposed to light is developed to thereby form a groove 254 corresponding to the second pixel region P2. At this time, a drain contact hole exposing the drain electrode of the thin film transistor can be formed together.

Figure 8C:
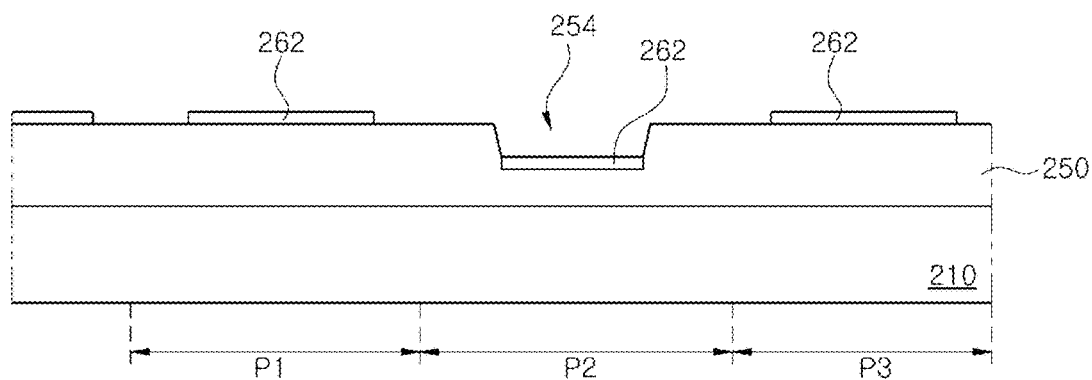

Next, in FIG. 8C, a first electrode 262 is formed in each pixel region P1, P2 and P3 by depositing a conductive material on the passivation layer 250 and patterning it through a mask process. Here, the first electrode 262 of the second pixel region P2 is disposed in the groove 254.

Meanwhile, in the second pixel region P2, the first electrode 262 can be formed on a side surface of the groove 254.

Figure 8D:
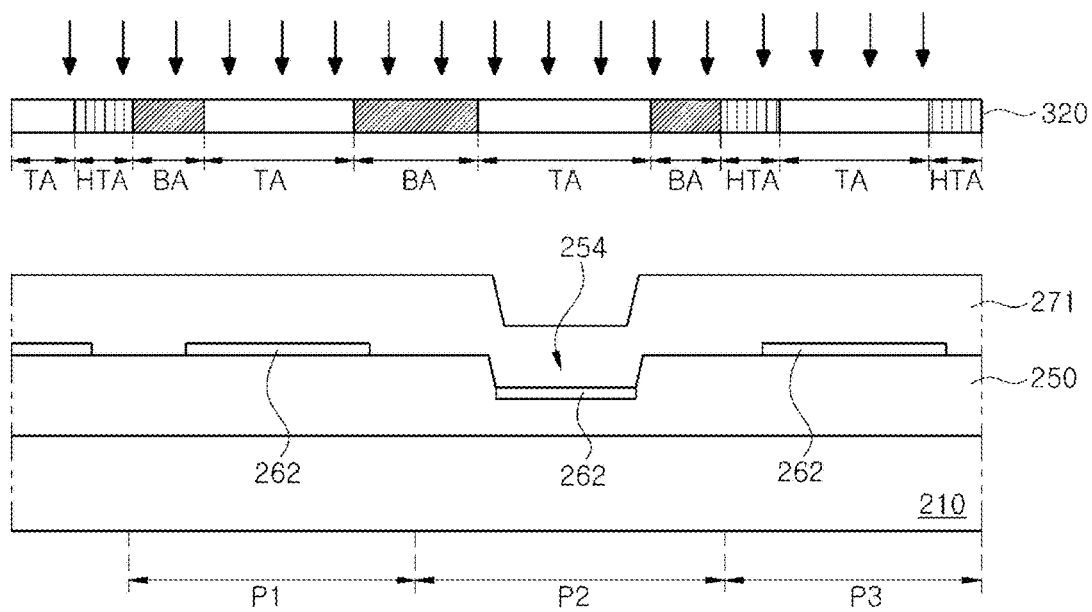

Next, in FIG. 8D, a bank material layer 271 is formed on the first electrode 262 by applying a bank material.

Then, a second photo mask 320 is disposed over the bank material layer 271, and the bank material layer 271 is exposed to light through the second photo mask 320.

The bank material layer 271 can be formed of a photosensitive organic insulating material or a photosensitive organic insulating material having a hydrophobic property and can have a positive photosensitivity in which a portion exposed to light is removed after a developing step. Alternatively, a photosensitive layer can be formed on the bank material layer 271, and the photosensitive layer can be exposed to light through the second photo mask 320.

The second photo mask 320 includes a light-blocking area BA, a light-transmitting area TA and a half-light transmitting area HTA. The light-transmitting area TA of the second photo mask 320 corresponds to a central portion of each pixel region P1, P2 and P3, the half-light transmitting area HTA corresponds to a peripheral portion of the third pixel region P3, and the light-blocking area BA corresponds to each of peripheral portions of the first and second pixel regions P1 and P2.

Figure 8E:
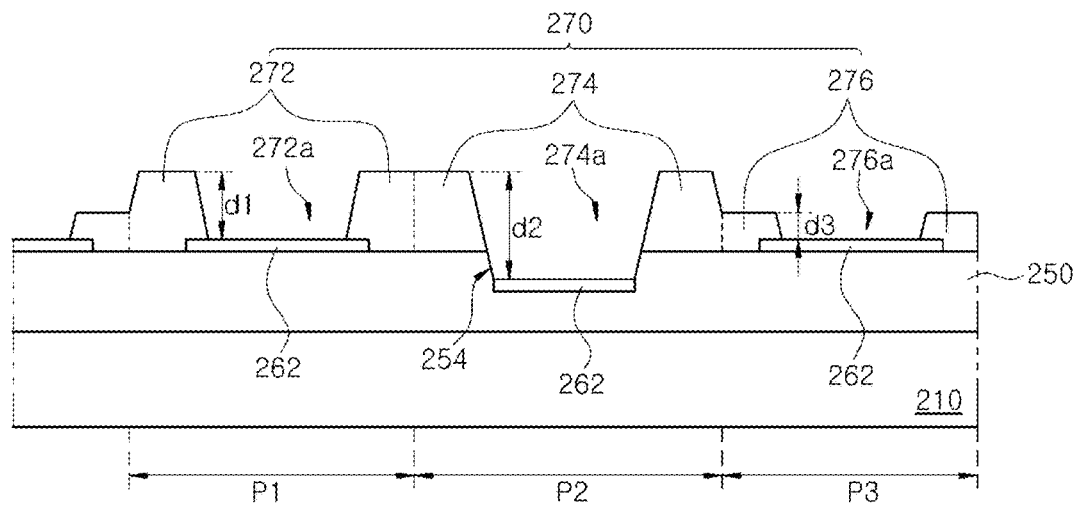

Then, in FIG. 8E, a bank layer 270 is formed by developing the bank material layer 271 of FIG. 8D. The bank layer 270 includes first, second and third banks 272, 274 and 276 corresponding to the first, second and third pixel regions P1, P2 and P3, respectively. The first, second and third banks 272, 274 and 276 have first, second and third openings 272a, 274a and 276a exposing the first electrodes 262 in the first, second and third pixel regions P1, P2 and P3, respectively.

Here, the second opening 274a in the second pixel electrode P2 includes the groove 254 of the passivation layer 250. In addition, the first bank 272 and the second bank 274 have the same height, and a height of the third bank 276 is smaller than the height of each of the first and second banks 272 and 274.

Accordingly, the first, second and third openings 272a, 274a and 276a have different depths. Namely, the first opening 272a of the first pixel region P1 has a first depth d1, the second opening 274a of the second pixel region P2 has a second depth d2, and the third opening 276a of the third pixel region P3 has a third depth d3. Here, the first depth d1 is smaller than the second depth d2 and larger than the third depth d3.

Figure 8F:
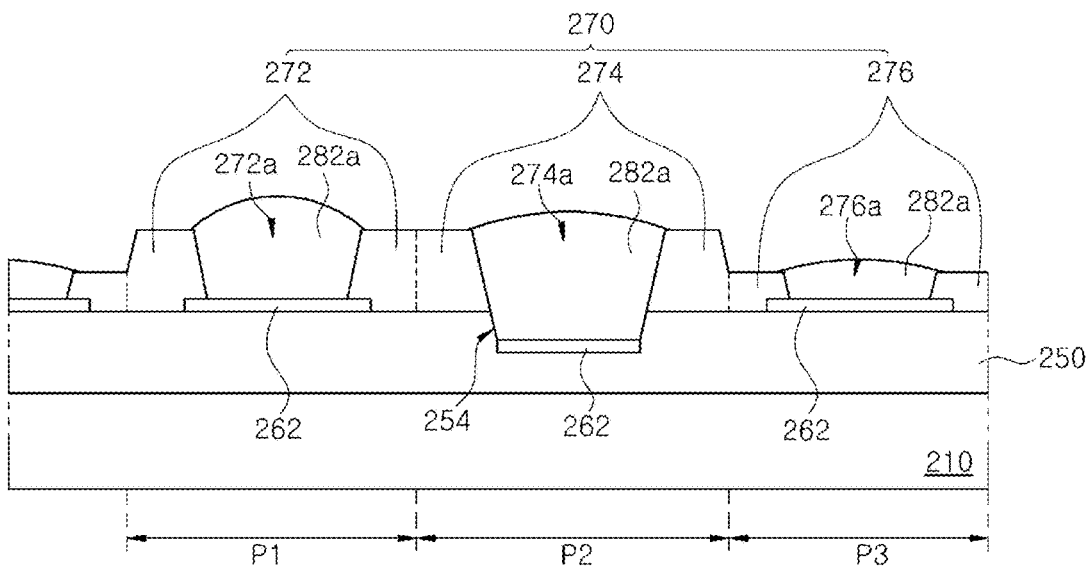

Next, in FIG. 8F, a solution layer 282a is formed in the opening 272a, 274a and 276a of each pixel region P1, P2 and P3 by dropping a solution containing a hole injecting material using an injection apparatus that includes a plurality of nozzles.

At this time, the hole injecting layers can be formed to have different thicknesses in the first, second and third pixel regions P1, P2 and P3, respectively, by differently dropping the solution in the respective pixel regions P1, P2 and P3. The number of drops of the solution can be decreased in the order of the first, second and third pixel regions P1, P2 and P3.

Figure 8G:
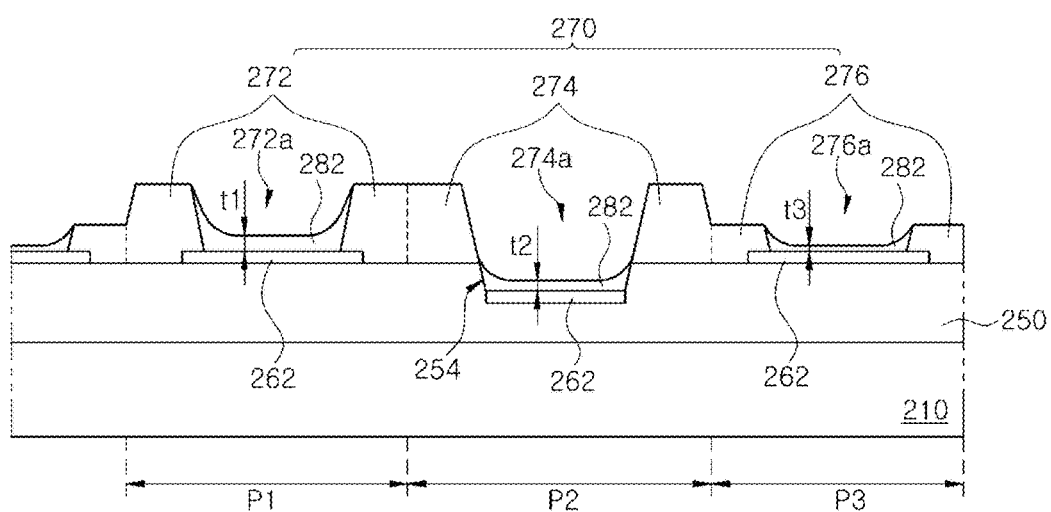

Next, in FIG. 8G, hole injecting layers 282 are formed in the first, second and third pixel regions P1, P2 and P3, respectively, by drying the solution layer 282a of FIG. 8F. At this time, the hole injecting layer 282 of the first pixel region P1 has a first thickness t1, the hole injecting layer 282 of the second pixel region P2 has a second thickness t2, and the hole injecting layer 282 of the third pixel region P3 has a third thickness t3. Here, each of the first, second and third thicknesses t1, t2 and t3 means a thickness at a central portion of each pixel region P1, P2 and P3.

The second thickness t2 is smaller than the first thickness t1 and larger than the third thickness t3. For instance, the first thickness t1 can be 70 nm to 80 nm, the second thickness t2 can be 50 nm to 60 nm, and the third thickness t3 can be 30 nm. The thicknesses t1, t2 and t3 are not limited to these.

Then, a hole transporting layer and the light emitting layer are sequentially formed on the hole injecting layer 282 of each pixel region P1, P2 and P3 through a solution process.

Like this, in the electroluminescent display device according to the second embodiment of the present disclosure, by differently forming the thicknesses of the hole injecting layers 282, the light emitting layers 280 of FIG. 7 can have different thicknesses in the first, second and third pixel regions P1, P2 and P3.

At this time, by differently forming the depths of the openings 272a, 274a and 276a in the first, second and third pixel regions P1, P2 and P3, it is not needed to limit the number of drops of the solution for the required thickness, and thus the overflow or dewet phenomenon can be prevented.

In the meantime, the depth of the second opening 274a in the second pixel region P2 is larger than the of the depth of the first opening 272a in the first pixel region P1, while the first thickness t1 of the hole injecting layer 282 in the first pixel region P1 is larger than the second thickness t2 of the hole injecting layer 282 in the second pixel region P2. Accordingly, it is possible to solve a problem that a thickness of a layer becomes thin at a central portion of a pixel region and the layer has low uniformity at central and peripheral portions of the pixel region because a pile-up phenomenon increases at the peripheral portion of the pixel region as the depths of the openings 272a, 274a and 276a increase when the solution is dried. That is, the pile-up phenomenon can be restrained as the depths of the openings 272a, 274a and 276a are lowered, and the thickness of the hole injecting layer 282 can be increased. In addition, as the depths of the openings 272a, 274a and 276a are lowered, the number of drops of the solution corresponding to the same thickness can be decreased. Therefore, by lowering the depth of the first opening 272a of the first pixel region P1 in which the hole injecting layer 282 of the thickest thickness is formed, the first thickness t1 of the hole injecting layer 282 can be obtained and a material for the hole injecting layer 282 can be reduced.

Moreover, in the first embodiment, since a three-tone mask, which includes a light-transmitting area, a light-blocking area, a first half-light transmitting area, and a second half-light transmitting area, is needed to form the bank layer 170 of FIG. 5 having the first, second and third banks of the different heights, it is relatively difficult to manufacture the device including the bank layer 170 of FIG. 5 compared to the second embodiment. On the other hand, in the second embodiment, by using the photo mask including the light-transmitting area, the light-blocking area and the half-light transmitting area, the openings 272a, 274a and 276a having the different depths can be formed easily without an additional process.

In the above embodiments of the present disclosure, the pixel regions have the same size, and the pixel regions have the same aperture ratio. However, the present disclosure is not limited to these.

More particularly, the red, green and blue light emitting materials have different lifetimes. Thus, by increasing the aperture ratio of the pixel region including the light emitting material of a relatively low lifetime, the pixel regions can have substantially the same lifetime. At this time, the size of the pixel region increases as the aperture ratio increases.

Furthermore, in the above embodiment(s) including the pixel regions of the same aperture ratio, the height of the bank layer or the depth of the opening is lowered in the pixel region where the hole injecting layer of the thickest thickness is formed. Alternatively, when the pixel regions have different aperture ratios, the height of the bank layer or the depth of the opening can be lowered in the pixel region where the number of drops of the solution, i.e., the amount of the dropped solution is largest.

In the present disclosure, since the light emitting layers are formed through the solution process, an electroluminescent display device having a large size and high definition can be produced. By forming the light emitting layers having the different thicknesses in the respective pixel regions, the micro cavity effect is implemented, and thus the color purity and light extraction efficiency can be improved.

In addition, the heights of the banks or the depths of the openings in the respective pixel regions are different from each other, and the light emitting layer in each pixel region has the uniform thickness. Therefore, the image quality of the device can be improved.

Moreover, this prevents or minimizes an increase in the power consumption and the lowering of the lifetime of the device due to the non-uniform thickness of the light emitting layer.

Furthermore, by using the photo mask including the light-transmitting area, the light-blocking area and the half-light transmitting area, the openings having the different depths can be formed easily without an additional process.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
a substrate on which first and second pixel regions are defined;
a passivation layer over the substrate;
a first electrode in each of the first and second pixel regions on the passivation layer;
a bank layer exposing the first electrode;
a light emitting layer on the first electrode exposed by the bank layer; and
a second electrode on the light emitting layer,
wherein the bank layer includes first and second openings exposing the first electrodes corresponding to the first and second pixel regions, respectively,
wherein the bank layer further includes a third opening exposing the first electrode corresponding to a third pixel region,
wherein a depth of the first opening is larger than a depth of the third opening,
wherein a height of the bank layer of the third pixel region is smaller than a height of the bank layer of the first pixel region, and
wherein the passivation layer has a groove in the second opening of the second pixel region, and each of the bank layer of the first and second pixel regions has a same height.

2. The electroluminescent display device of claim 1, wherein a height of the bank layer of the second pixel region is larger than the height of the bank layer of the first pixel region.

3. The electroluminescent display device of claim 1, wherein a thickness of the light emitting layer at a central portion of the first pixel region is larger than a thickness of the light emitting layer at a central portion of the second pixel region.

4. The electroluminescent display device of claim 3, wherein the light emitting layer in each of the first and second pixel regions includes a hole auxiliary layer, a light emitting material layer and an electron auxiliary layer, and wherein a thickness of the hole auxiliary layer at a central portion of the first pixel region is larger than a thickness of the hole auxiliary layer at a central portion of the second pixel region.

5. The electroluminescent display device of claim 3, wherein the first and second pixel regions have a same aperture ratio.

6. The electroluminescent display device of claim 3, wherein the light emitting layer in the first pixel region emits light with a longer wavelength than the light emitting layer in the second pixel region.

7. The electroluminescent display device of claim 1, wherein a portion of the bank layer of the first pixel region is connected to a portion of the bank layer of the second pixel region adjacent thereto to thereby form one body.

8. The electroluminescent display device of claim 1, wherein a thickness of the passivation layer corresponding to the first pixel region is larger than a thickness of the passivation layer corresponding to the groove in the second pixel region.

9. The electroluminescent display device of claim 1, wherein a thickness of the light emitting layer at a central portion of the third pixel region is smaller than a thickness of the light emitting layer at a central portion of the second pixel region.

10. The electroluminescent display device of claim 9, wherein the light emitting layer in the third pixel region emits light with a shorter wavelength than the light emitting layer in the second pixel region.

11. The electroluminescent display device of claim 1, wherein a portion of the bank layer of the second pixel region is connected to a portion of the bank layer of the third pixel region adjacent thereto to thereby form one body.

12. The electroluminescent display device of claim 1, wherein the groove of the passivation layer has a depth smaller than a thickness of the passivation layer.

13. The electroluminescent display device of claim 1, wherein the first, second and third pixel regions correspond to red, green and blue pixel regions respectively.

14. An electroluminescent display device comprising:
a substrate on which first, second and third pixel regions are defined;
a passivation layer over the substrate;
a first electrode in each of the first, second and third pixel regions on the passivation layer;
a bank layer exposing the first electrode;
a light emitting layer on the first electrode exposed by the bank layer; and
a second electrode on the light emitting layer,
wherein the bank layer includes first, second and third openings exposing the first electrodes corresponding to the first, second and third pixel regions, respectively,
wherein a height of the bank layer of the third pixel region is different from a height of the bank layer of each of the first and second pixel regions,
wherein the height of the bank layer of the first pixel region is different from the height of the bank layer of the second pixel region, and
wherein the passivation layer has a groove in either the first opening of the first pixel region or the second opening of the second pixel region.

15. The electroluminescent display device of claim 14, wherein a depth of the second opening is different than a depth of the first opening.

* * * * *